Jan. 28, 1969 F. C. ZIELINSKI ET AL 3,424,992
WIDEBAND POWER AMPLIFIER
Filed June 30, 1965
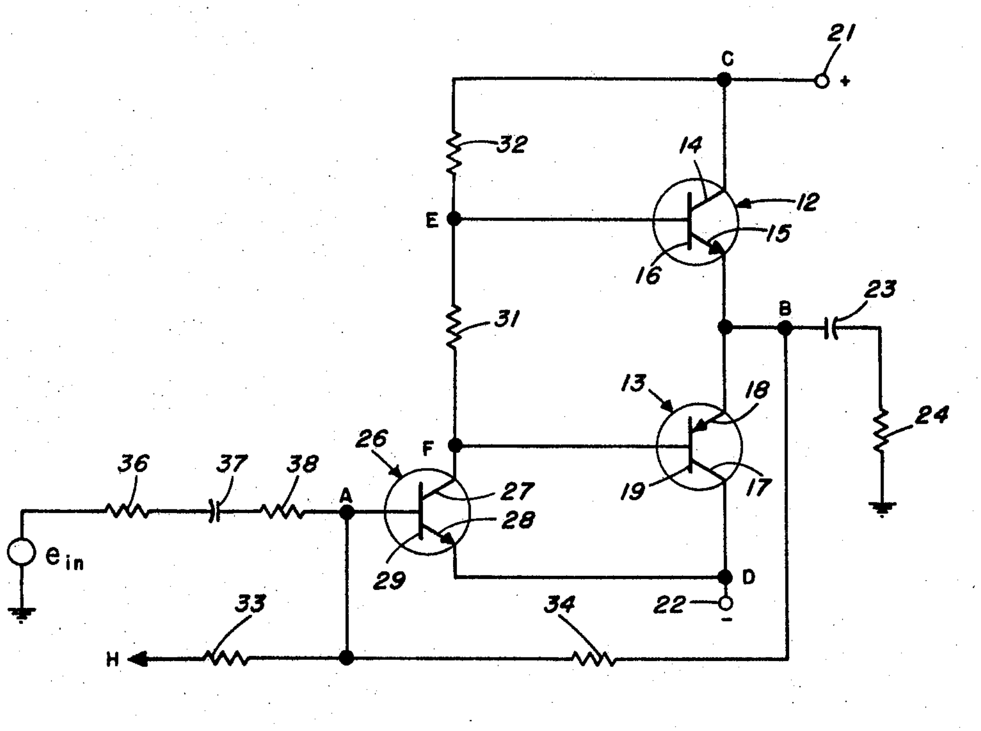
INVENTORS
FREDERICK C. ZIELINSKI
WARREN A. WILLIAMS
BY Claude Funkhouser
ATTORNEY
Leonard L. Lourie
AGENT United States Patent Office 3,424,992

Patented Jan. 28, 1969

3,424,992
WIDEBAND POWER AMPLIFIER

Frederick C. Zielinski, Glen Burnie, and Warren A. Williams, Severna Park, Md., assignors, by mesne assignments to the United States of America as represented by the Secretary of the Navy Filed June 30, 1965, Ser. No. 468,649
U.S. Cl. 330—13 2 Claims
Int. Cl. H03f 3/30

ABSTRACT OF THE DISCLOSURE

There is disclosed an intermediate frequency amplifier within transistors are used in push-pull relationship with feedback means to a transistor driver for maintaining DC current biasing and having a gain not dependent on the transistor's parameters.

The present invention relates to a power amplifier circuit and more particularly to an intermediate frequency amplifier for a radar system wherein transistors are used in a push-pull relationship with feedback means to a transistor driver for maintaining direct current biasing and single gain stability over environmental temperature range.

An object of the present invention is to provide an amplifier circuit wherein the gain of the circuit is not dependent on the parameters of the transistors.

Another object of the present invention is to provide a radar intermediate frequency amplifier having the minimum of circuit elements.

A further object of the present invention is to provide a wideband power amplifier wherein the gain can be set by the values of the input and feedback resistances.

Other objects, advantages and novel features of the present invention will become apparent from the following detailed description of the invention when considered in conjunction with the accompanying drawings wherein:

The single figure is an electrical circuit schematic diagram of the present invention.

Referring now to the drawing, the output stage of the amplifier of the present invention has a pair of complementary transistors 12 and 13 connected together to operate in a push-pull manner. The first transistor 12 of the pair is a n-p-n semi-conductor having a collector 14, emitter 15 and base 16. The second transistor is a p-n-p type having a collector 17, emitter 18 and base 19.

The positive and negative terminals 21 and 22 of a biasing supply means, not shown, are connected respectively to the points C and D to provide the required positive voltage for collector 14 of the first transistor 12 and the negative voltage for the collector 17 of the second transistor 13. The emitters 15 and 18 of the complementary transistors are connected together and capacitively coupled through capacitor 23 to a load device or impedance 24 which is connected to a reference or ground potential.

A driver transistor 26 of the n-p-n type is used to supply an amplified input voltage to the bases 16 and 19 of the first and second transistors 12 and 13. The driver 26 has a collector 27, emitter 28 and base 29. The emitter 28 is connected directly to the point D for negative biasing. The collector 27 of the driver is connected directly to the base 19 of the second transistor 13 and through resistor 31 to the base 16 of the first transistor 12. To provide the required positive biasing for collector 27 of the driver 26, a further connection is made from resistor 31 though resistor 32 to the positive potential of the biasing supply means at point C. The base 29 of the driver is connected to a biasing supply which is more negative than point D, at point H through resistor 33. Since the voltage potential from the collector 27 to the base 29 is reversed-biased and from the emitter 28 to the base 29 is forward-biased, the n-p-n driver is established to operate for class A amplification.

In order to insure stability of gain over the bandwidth and to maintain the proper direct current biasing of the emitters 15 and 18 of transistors 12 and 13, a feedback resistor 34 is connected between the emitters 15 and 18 at point B to the base 29 of driver 26. A portion of the amplified output signal across the load impedance at the emitters 15 and 18 is applied to the base 29 of the driver 26 through feedback resistor 34. The polarity of the amplified signal is reversed to that of the input signal on the base 29 and thus constitutes a negative feedback. The application of a negative feedback signal to the driver stage minimizes the variations in the gain of the amplifier from the particular requirements for the radar system.

The direct current voltage at point B is set to be halfway between the voltage between points C and D. This voltage at B can be defined as follows:

$$V_B = I_{R_{33}} R_{34} + \frac{(V_A - V_H)}{R_{33}}$$

where the current through resistor 33, $I_{RD33} = (V_A - V_H)$ consequently $$V_B = \frac{(V_A - V_H) R_{34}}{R_{33}} + (V_A - V_D) \quad (1)$$

From Equal 1, it is evident that resistor 33 is used for direct current biasing. The direct current voltage at the collector of the driver 26 is approximately equal to the voltage at point B. The voltage $(V_E - V_F)$ across resistor 31 is set at one volt so that the bases 16 and 19 of the push-pull transistors 12 and 13 are forward-biased. This method of biasing eliminates the crossover distortion which may occur across the load impedance in the operation of the push-pull transistors.

An input driving stage with an output resistance 36 applies an alternating signal $e_{in}$ to the base 29 of the driver 26 through a coupling capacitor 37 and input resistor 38.

With the application of an alternating current input signal to the base of the driver, the input signal is amplified and inverted by the driver. A negative going input signal when applied to the base 29 of the n-p-n driver 26 will cause less internal transistor current to flow thereby decreasing the electron current flow through resistors 31 and 32. This decrease of electron current raises the biasing potential on the bases 16 and 19 of n-p-n transistor 12 and the p-n-p transistor 13 respectively thereby causing transistor 12 to operate and transistor 13 to shut off. The raising of the bias on the base 16 of transistor 12 increases the internal current from the emitter 15 to the collector 14 which causes an electron current to flow through the load impedance 24 raising the voltage potential at point B.

When a positive going input signal is applied to the base 29 of the n-p-n driver 26, a greater internal current flows through the driver from emitter 28 to collector 27 causing a greater electron current to pass through resistors 31 and 32 whereby the voltage potential at points E and F are less. This decrease in voltage at E and F which is transferred to the bases 16 and 19 causes the transistor 12 to turn off and the transistor 13 to turn on. The increase in negative bias from the emitter 18 to the base 19 of transistor 13 causes an increase in the internal current through transistor 13. This increase in current through transistor 13 causes an electron current to flow from the point B through the load impedance 24 to ground potential thus lowering the potential at point B. From the above explanation of the operation of the amplifier of the present invention, the electron current flow through the load impedance alternates depending upon the alternating operation of transistors 12 and 13 and thus exhibits a push-pull amplification of the input signal.

The gain equation for the circuit of the present invention was calculated to be $$\frac{R_{34}}{R_{38}+R_{36}}=G \quad (2)$$

where resistor 34 is the feedback resistor, resistor 38 is the input resistor and resistor 36 is the output resistance of the input driving stage. As noted from the above Equation 2, the circuit of the present invention is not dependent upon the parameters of the transistors. Consequently, any change or variations in these parameters due to the temperature range of the environment of the radar system does not influence the gain of the circuit.

The efficiency of a circuit is equal to the ratio of alternating current power out to direct current power in. For circuit of the present invention, a DC power input of 0.835 watt was required which resulted in an efficiency of 68.4%. A higher efficiency could be obtained by reducing the DC current through the driver by increasing the value of resistor 32. When the value of resistor 32 is increased, the bandwidth of the amplifier decreases therefore in order to meet the bandwidth and operating frequency requirement a trade-off was necessary.

The particular amplifier of the present invention was tested and the reliability thereof was found to be somewhere in the neighborhood of 200,000 hours mean time between failure rate. Two of the advantages of the present invention are that the gain of the circuit can be set easily by selecting the proper values of the feedback resistor 34 and input resistor 38 and that a variety of gain can be made by such selection. The DC stability of the amplifier of the present invention is within a 0.25 db.

The power amplifier of the present invention was capable of supplying 0.57 watt into an 800 ohm load impedance at five hundred (500) kilocycles plus or minus two hundred (200) kilocycles. The gain of the amplifier was within plus or minus one (1) db about the initial gain required for the radar system within the environment temperature range thereof.

Obviously, many modifications and variations of the present invention are posssible in the light of the above teachings. It is therefore to be understood that within the scope of the appended claims the invention may be practiced otherwise than as specifically described.

What is claimed is:

1. A power amplifier comprising in combination first bias supply means having positive and negative terminals;

a first transistor having a base, emitter and collector, said collector of said first transistor being connected to said positive terminal of the bias supply means for positive biasing;

a second transistor having a base, emitter and collector, said collector of said second transistor being connected to said negative terminal of the bias supply means for negative biasing, said emitters of said first and second transistors being connected together;

a load impedance connected capacitively to said emitters and directly to ground potential;

a driver transistor having a base, emitter and collector, said driver emitter being connected to said negative terminal for negative biasing, said driver collector being directly connected to said base of said second transistor;

low resistance means connected between said driver collector and said base of said first transistor;

direct current biasing resistance means for said driver transistor connected between said base of said first transistor and said positive terminal for positive biasing;

resistance feedback means connected between said emitters of said first and second transistors and said base of said driver;

separate second biasing means connected to said base of said driver for providing forward biasing between said emitter and said base of said driver; and input means connected to said driver base for applying an alternating signal to driver whereby the positive portion of said signal on the collector of said driver turns on said first transistor and turns off said second transistor and whereby the negative portion of said amplified signal turns on said second transistor and turns off said first transistor so that an amplified alternating signal is developed across the load impedance whose gain is not dependent upon the parameters of the transistors.

2. A broadband power amplifier comprising in combination first bias supply means having positive and negative terminal;

a n-p-n transistor having a base, emitter and collector, said collector of said n-p-n transistor being connected to said positive terminal for positive biasing;

a p-n-p transistor having a base, emitter and collector, said collector of said p-n-p transistor being connected to said negative terminal for negative biasing;

said transistors being connected together at said emitters to form a complementary pair of semi-conductors of a push-pull output stage;

a n-p-n transistor driver having a base, emitter and collector, and emitter of said driver being connected to said negative terminal for negative biasing, said collector of said driver being directly connected to said base of said p-n-p transistor;

low resistance means connected between said collector of said driver and said base of said n-p-n transistor;

direct current biasing resistance means for said collector of said driver connected between said low reistance means and said positive terminal for positive biasing;

separate second biasing means connected to said base of said driver for providing forward biasing between said emitter and said base of said driver;

input means connected to said driver for applying an alternating signal to said driver whereby a positive portion of an alternating signal on the collector of said driver turns on said n-p-n transistor and turns off said p-n-p transistor and a negative portion turns on said p-n-p transistor and turns off said n-p-n transistor thus developing an amplified alternating signal at the emitters of said complementary transistors; and resistance feedback means connected between said emitters of said complementary transistors and said base of said driver whereby direct current biasing is maintained on said emitters of said complementary transistors and a portion of the amplified alternating signal at said emitter of said complementary transistors is applied to said base of said driver to insure the stability of the gain of said amplifier over the particular required bandwidth under environmental temperature changes.

References Cited

UNITED STATES PATENTS

| | | | |
|---|---|---|---|
| 2,789,164 | 4/1957 | Stanley | 330—13 |
| 2,860,195 | 11/1958 | Stanley | 330—13 |

ROY LAKE, *Primary Examiner.*

J. B. MULLINS, *Assistant Examiner.*

U.S. Cl. X.R.

330—15, 17, 18, 19, 22, 25, 28